United States Patent
Sarda

(10) Patent No.: US 10,511,315 B1
(45) Date of Patent: Dec. 17, 2019

(54) ADAPTIVE JITTER AND SPUR ADJUSTMENT FOR CLOCK CIRCUITS

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/138,080

(22) Filed: Sep. 21, 2018

(51) Int. Cl.
| | |
|---|---|
| *H03L 7/197* | (2006.01) |
| *H03L 7/081* | (2006.01) |
| *G06F 1/08* | (2006.01) |
| *H03K 23/66* | (2006.01) |
| *H03L 7/183* | (2006.01) |

(52) U.S. Cl.
CPC .............. *H03L 7/1976* (2013.01); *G06F 1/08* (2013.01); *H03K 23/667* (2013.01); *H03L 7/081* (2013.01); *H03L 7/183* (2013.01)

(58) Field of Classification Search
CPC ....... H03L 7/093; H03L 7/0992; H03L 7/091; H03L 7/085; H03L 7/099; H03L 7/06; H03L 7/18; H03L 7/16; H03L 7/1974
USPC ........................ 327/156, 158, 161
See application file for complete search history.

(56) References Cited

U.S. PATENT DOCUMENTS

| | | | |
|---|---|---|---|
| 6,888,413 B1 * | 5/2005 | Adams | ............... H03F 1/0277 327/105 |
| 7,800,451 B2 | 9/2010 | Fu et al. | |
| 8,514,118 B2 | 8/2013 | Eldredge | |
| 8,692,599 B2 | 4/2014 | Gong et al. | |
| 9,362,936 B1 | 6/2016 | Caffee et al. | |
| 9,379,879 B1 | 6/2016 | Caffee et al. | |
| 2015/0145567 A1 | 5/2015 | Perrott | |
| 2018/0145696 A1 | 5/2018 | Sarda | |

FOREIGN PATENT DOCUMENTS

WO   WO-2016207758 A1 * 12/2016 ............. H03L 7/197

* cited by examiner

*Primary Examiner* — John W Poos
(74) *Attorney, Agent, or Firm* — Zaborin Cave LLP

(57) ABSTRACT

An apparatus includes a control circuit configured to generate a frequency divider control signal approximating a fractional divide ratio. The apparatus includes a frequency divider configured to generate an output clock signal based on an input clock signal and an adjusted frequency divider control signal. The output clock signal is a frequency-divided version of the input clock signal. The apparatus includes a measurement circuit configured to provide digital time information corresponding to an edge of the output clock signal. The apparatus includes an adaptive adjustment circuit configured to generate the adjusted frequency divider control signal based on the frequency divider control signal and the digital time information.

17 Claims, 9 Drawing Sheets

ADAPTIVE JITTER AND SPUR ADJUSTMENT FOR CLOCK CIRCUITS

BACKGROUND

Field of the Invention

This invention relates to generating clock signals for electronic devices.

Description of the Related Art

Clock synthesizers generate clock signals that may be used in a wide variety of electronic products. Referring to FIG. 1A, a typical clock synthesizer utilizes a phase-locked loop (PLL) supplied with a reference clock signal from a source such as a crystal oscillator. The output frequency of the signal supplied by the synthesizer can be determined by a divider value of the feedback divider in the PLL. Thus, a reference frequency supplied to the PLL is multiplied based on the divider value to generate the synthesized clock. For example, feedback divider 118 of PLL 100 may include a fractional-N feedback divider 119. In at least one embodiment, divider value DIVIDE RATIO is a digital frequency ratio translated from a code, e.g., a code provided by non-volatile memory (NVM). Sigma-delta modulator 121 supplies a divide sequence corresponding to the target divider ratio to fractional-N feedback divider 119.

FIG. 1B illustrates a timing diagram of an exemplary divide by 2.25. The input clock (REFCLK) is shown as waveform 151, having a period of one unit interval (UI). The output of the fractional-N divider, feedback clock signal DIVCLK, is shown in waveform 153. Waveform 153 illustrates how the divide ratio of 2.25 is achieved by a sequence of divide by 2 for three periods and a divide by 3 for one period, assuming control of the fractional-N divider by a first order sigma-delta modulator. Waveform 155 illustrates the ideal waveform for a divide ratio of 2.25. The quantization noise of the modulator, at the output of divider 118 of FIG. 1A, is shown as the difference at 157, 159, and 161 of FIG. 1B, between the actual output of the fractional-N divider shown in waveform 153 and the ideal output for a divide by 2.25 shown in waveform 155.

Referring back to FIG. 1A, fractional-N divider 119 supplies the divided signal to phase/frequency detector and charge pump 112 with noise associated with the nature of the fractional-N divider. In fractional-N synthesis, the fractional-N noise may be filtered out by the PLL loop. However, jitter and spurs in the output synthesized clock cause loss of data and limit performance in the target application. Accordingly, low-cost, low-noise, flexible clock synthesizer techniques are desired.

SUMMARY OF EMBODIMENTS OF THE INVENTION

In at least one embodiment of the invention, an apparatus includes a frequency divider configured to generate an output clock signal based on an input clock signal and an adjusted frequency divider control signal. The output clock signal is a frequency-divided version of the input clock signal. The apparatus includes a measurement circuit configured to provide digital time information corresponding to an edge of the output clock signal. The apparatus includes an adaptive adjustment circuit configured to generate the adjusted frequency divider control signal based on a frequency divider control signal and the digital time information. The frequency divider control signal approximates a fractional divide ratio. In at least one embodiment, the measurement circuit is a time-to-digital converter configured to provide as the digital time information, a digital time code corresponding to a delay between an edge of the output clock signal with respect to a corresponding edge of a reference signal.

In at least one embodiment of the invention, a method for reducing spurs in a clock signal includes generating a frequency divider control signal comprising a sequence of integer divide values approximating a fractional divide ratio. The method includes generating an output clock signal based on an input clock signal and an adjusted frequency divider control signal. The output clock signal is a frequency-divided version of the input clock signal. The method includes providing digital time information based on the output clock signal. The method includes generating the adjusted frequency divider control signal based on the frequency divider control signal and the digital time information. In at least one embodiment, providing digital time information comprises generating a digital code corresponding to a delay between an edge of the output clock signal with respect to a corresponding edge of a reference signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1A:
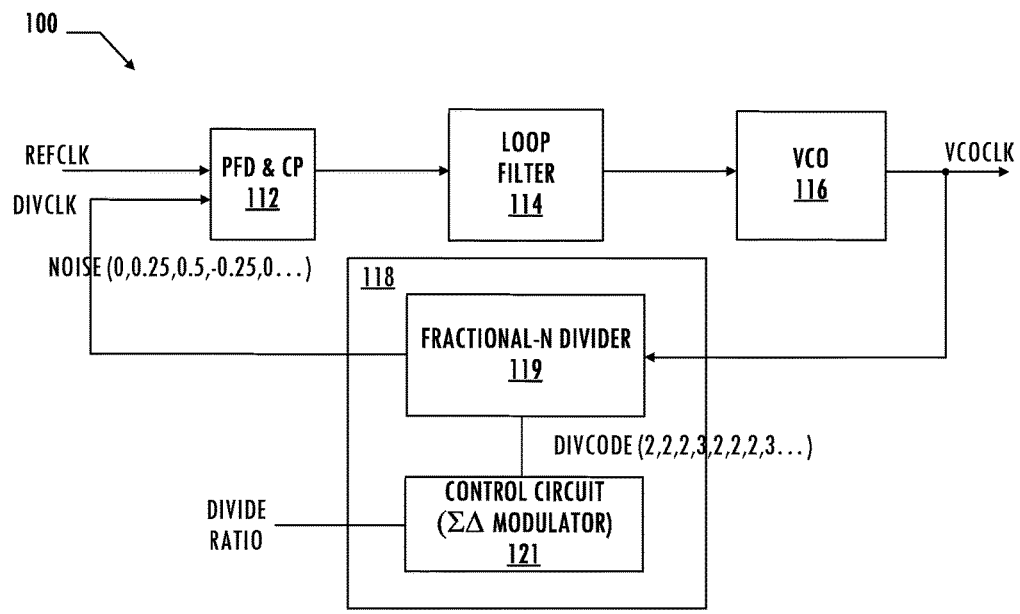
FIG. 1A illustrates a functional block diagram of an exemplary clock synthesizer phase-locked loop (PLL) including a fractional-N frequency divider.
Figure 1B:
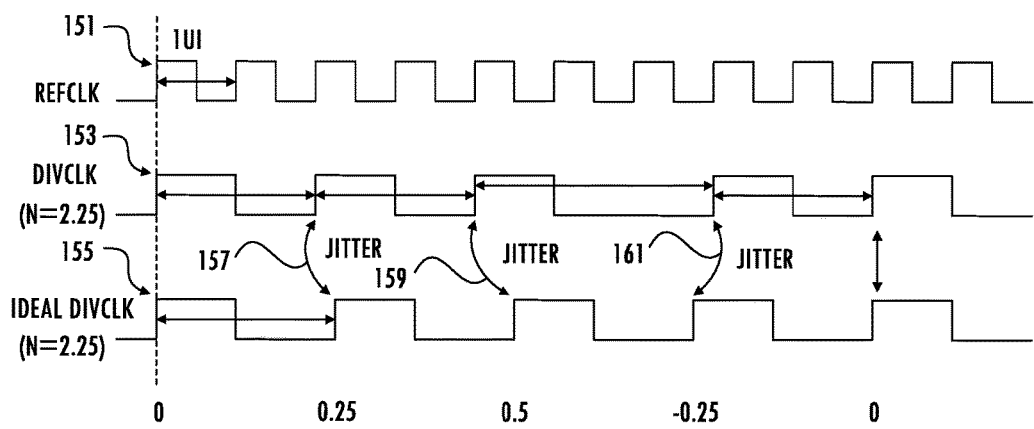
FIG. 1B illustrates exemplary timing waveforms for the clock synthesizer PLL of FIG. 1A.
Figure 2:
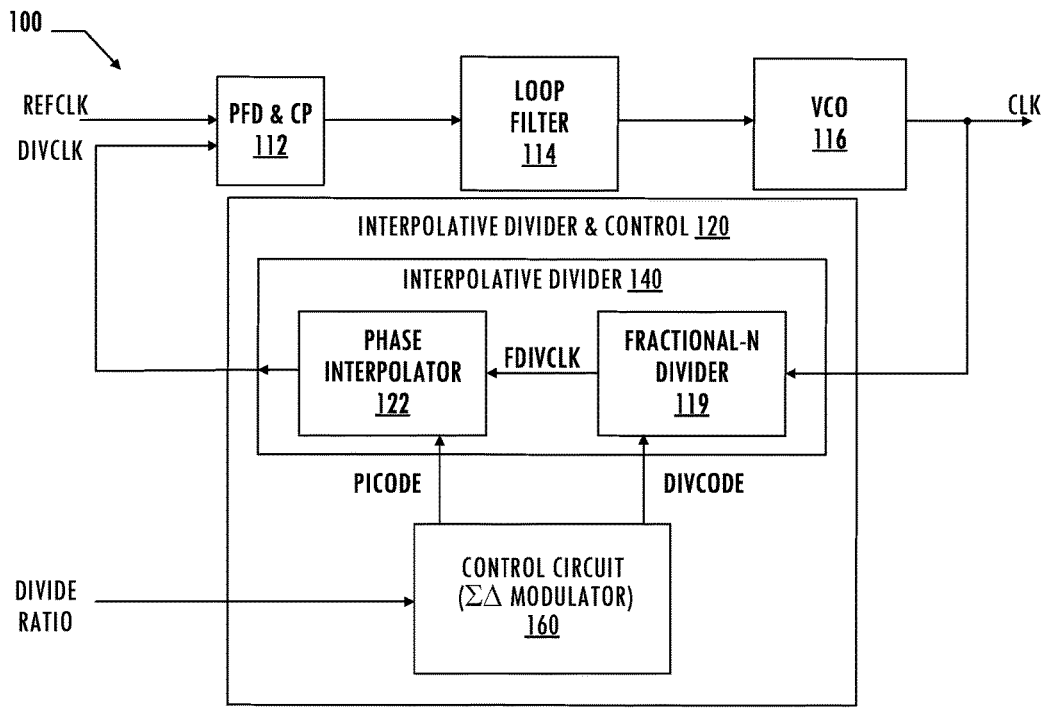
FIG. 2 illustrates a functional block diagram of an exemplary clock synthesizer PLL including an interpolative divider.

FIG. 2 illustrates an exemplary architecture of a clock synthesizer phase-locked loop (PLL). Phase-locked loop 100 includes a phase/frequency detector and charge pump 112, a loop filter 114, and a voltage-controlled oscillator (VCO) 116. In at least one embodiment, oscillator 116 is implemented as a ring oscillator, an LC oscillator, or other suitable oscillator structure responsive to a control signal provided by loop filter 114 to generate output clock signal VCOCLK having a frequency that is the frequency of the reference clock signal multiplied by the divide ratio. Phase/frequency detector and charge pump 112 receives reference clock signal REFCLK, which is provided by a fixed source such as a crystal oscillator, a microelectromechanical structure (MEMS) oscillator, or other suitable source, and receiving feedback clock signal DIVCLK. Fractional-N divider 119 introduces a digital quantization error that causes phase noise (i.e., jitter and spurs) in feedback clock signal FDIVCLK. For example, feedback clock signal FDIVCLK may have jitter of up to one VCO clock cycle.

A technique for reducing jitter in PLL 100 includes adjusting the phase of the frequency-divided signal according to a phase error control signal, PICODE, generated by interpolative divider 120, which is in the feedback path of PLL 100. Interpolative divider techniques for reducing noise associated with a fractional-N divider are described in U.S. Pat. No. 7,417,510, filed Oct. 17, 2006, entitled "Direct Digital Interpolative Synthesis," naming Yunteng Huang as inventor, which application is hereby incorporated by reference. Interpolative divider 120 includes interpolative divider 140 that includes phase interpolator 122 and fractional-N divider 119. Phase interpolator 122 adjusts the phase of feedback clock signal FDIVCLK according to the digital quantization error to reduce error in feedback clock signal DIVCLK, thereby introducing a phase adjustment prior to phase/frequency detector and charge pump 112 of PLL 100. Interpolative divider 120 includes a control circuit 160, which may include a typical first-order sigma-delta modulator. Control circuit 160 generates divider control signal DIVCODE for fractional-N divider 119. In addition, control circuit 160 generates phase interpolator control signal PICODE and supplies it to phase interpolator 122. Phase interpolator 122 interpolates between the feedback clock signal FDIVCLK and one or more delayed versions of feedback clock signal FDIVCLK (one or more equally-spaced phases of feedback clock signal FDIVCLK) based on phase interpolator control signal PICODE, which corresponds to the phase error, using techniques that are well known in the art. Interpolative divider 120 provides the output of phase interpolator 122 to phase/frequency detector and charge pump 112.

Figure 3:
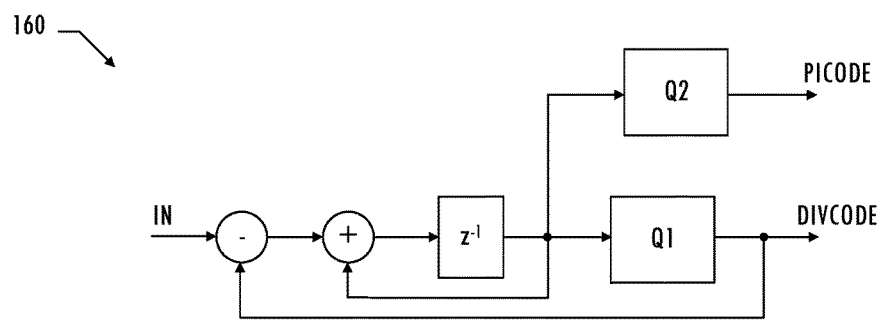
FIG. 3 illustrates a functional block diagram of an exemplary control circuit of the interpolative divider of FIG. 2.

Referring to FIGS. 2 and 3, control circuit 160 may include a first-order sigma-delta modulator that is implemented in digital circuitry (e.g., using digital delay elements, adders, comparators, etc.). Control circuit 160 generates both phase interpolator control signal PICODE and divider control signal DIVCODE. Divider control signal DIVCODE may be a truncated version (i.e., integer portion) of the integrator output signal, and phase interpolator control signal PICODE (which corresponds to the digital quantization error) is the truncated portion (i.e., fractional portion) of the integrator output signal. In at least one embodiment of PLL 100, divider control signal DIVCODE is a code having a range of integer values n≤DIVCODE≤n+1, and phase interpolator control signal PICODE has a range of values of 0≤PICODE≤($2^F$−1). For example, phase interpolator control signal PICODE may have F bits (e.g., F=8), corresponding to P=$2^F$ (e.g., 256) different $PICODE_i$ (e.g., 0≤i≤P−1), which correspond to P different delay values. A maximum delay is introduced by a PICODE (e.g., $PICODE_{P-1}$) corresponding to a target maximum delay of almost one VCO cycle (e.g., a delay of 255/256×a period of one VCO cycle). The target delay increment (i.e., a delay difference between consecutive phase interpolator control signal PICODES, e.g., the delay difference between $PICODE_i$ and $PICODE_{i+1}$, where 0≤$PICODE_i$≤$PICODE_{P-1}$) is one VCO cycle divided by P. Phase interpolator 122 delays the signal received from fractional-N divider 119 according to phase interpolator control signal PICODE to reduce or eliminate phase error before phase/frequency detector and charge pump 112, thereby reducing the noise in feedback clock signal DIVCLK, which allows the PLL loop bandwidth to be wider and reduces noise contributions of VCO 116 to output clock signal CLK. The reduction in phase error also allows reduction in current of phase/frequency detector and charge pump 112 into a current, thereby reducing phase noise. In addition, the reduction in phase error reduces the linearity requirements on phase/frequency detector and charge pump 112. However, linearity and gain error of phase interpolator 122 introduces spurs into feedback clock signal DIVCLK that may not be filtered out by loop filter 114.

Figure 4:
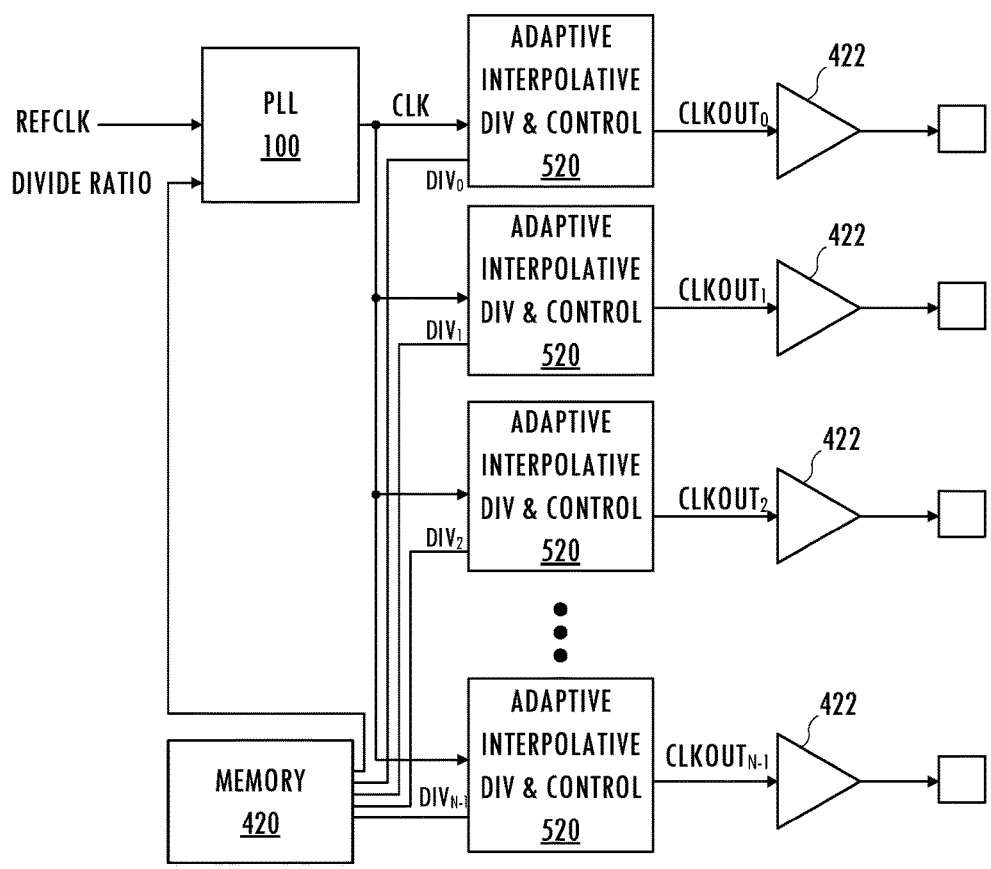
FIG. 4 illustrates a functional block diagram of a clock synthesizer incorporating multiple adaptive interpolative dividers and control circuits to generate multiple independent output clock signals consistent with at least one embodiment of the invention.

A technique for reducing jitter and spurs in a synthesized clock signal adaptively adjusts the output clock signal according to jitter and spurious tones in the output clock signal by adaptively adjusting a control signal of a corresponding frequency divider of a clock synthesizer. Referring to FIG. 4, an exemplary interpolative clock synthesizer includes PLL 100 and multiple interpolative dividers responsive to the output of PLL 100 to generate corresponding output clock signal based on distinct control signals. Memory 420 supplies a divide ratio to an interpolative divider within PLL 100. In addition, memory 420 provides corresponding fractional divide ratios (e.g., divide ratios $DIV_0$, $DIV_1$, $DIV_2$ . . . , $DIV_{N-1}$) to one or more adaptive interpolative dividers and control circuits 520 that generate respective clock signals based on the output PLL 100. Adaptive interpolative dividers and control circuits 520 provide output clock signals $CLKOUT_0$, $CLKOUT_1$, $CLKOUT_2$ . . . , $CLKOUT_{N-1}$ to output drivers 422.

Figure 5:
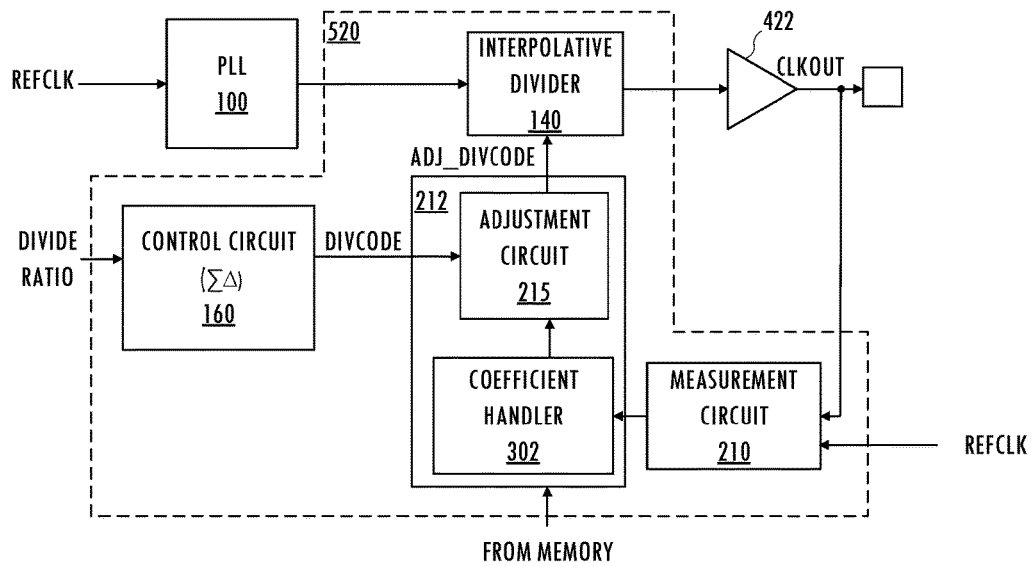
FIG. 5 illustrates a functional block diagram of an adaptive interpolative divider responsive to a buffered output clock signal consistent with at least one embodiment of the invention.

Referring to FIG. 5, in at least one embodiment, similar to the interpolative divider described above, adaptive interpolative divider and control 520 includes interpolative divider 140 and interpolative divider control circuit 160. However, adaptive interpolative divider and control 520 also includes adaptive adjustment circuit 212, which adjusts control signal DIVCODE generated by interpolative divider control circuit 160 according to an output of measurement circuit 210 and provides adjusted control signal ADJ_DIV-CODE to interpolative divider 140.

Figure 6:
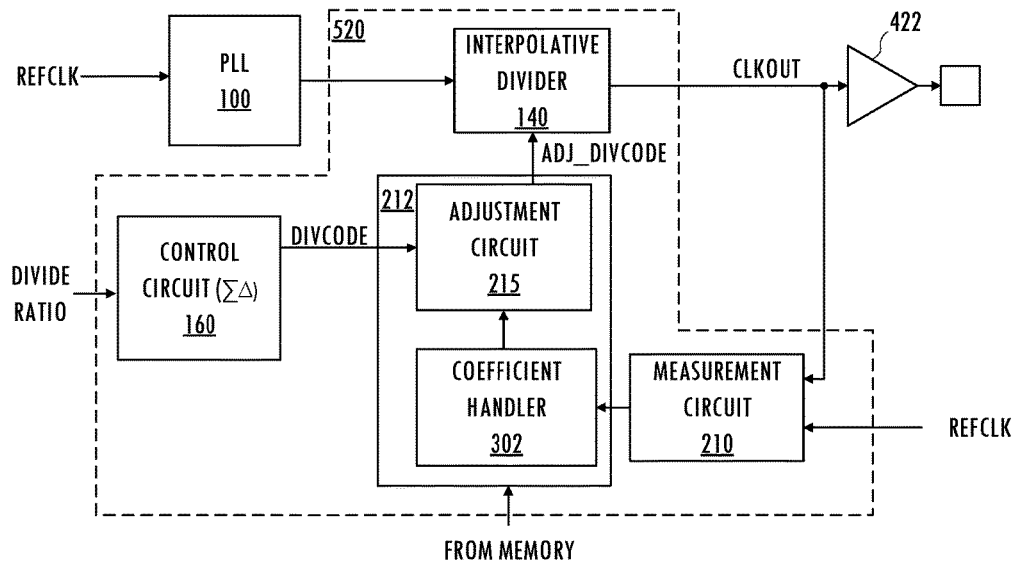
FIG. 6 illustrates a functional block diagram of an adaptive interpolative divider using feedback prior to an output driver consistent with at least one embodiment of the invention.

Measurement circuit 210 samples output clock signal CLKOUT and provides a digital measurement signal based on the sample. In at least one embodiment, measurement circuit 210 is a time-to-digital converter circuit that provides a digital time code corresponding to a delay between an edge of output clock signal CLKOUT with respect to a corresponding edge of reference clock signal REFCLK. In at least one embodiment, the time-to-digital converter includes a counter controlled by reference clock signal REFCLK to output a digital count of periods of reference clock signal REFCLK between sequential edges of output clock signal CLKOUT. In other embodiments, a digital phase and frequency detector or an analog-to-digital converter may be used to provide the digital measurement signal and processed accordingly. Typically, the output of a frequency divider is buffered by an output driver circuit or otherwise processed according to the target application. The buffer or other circuit may introduce a delay to the output signal. However, if the group delay is constant, measurement circuit 210 may sample the output clock signal after output driver 422, as illustrated in FIG. 5, or prior to output driver 422, as illustrated in FIG. 6, without substantial distortion of the measurement provided to coefficient handler 302. Coefficient handler 302 processes the output of measurement circuit 210, as further described below, to determine updates to adjustment circuit 215. Adjustment circuit 215 adjusts control signal DIVCODE to provide adjusted control signal ADJ_DIVCODE to interpolative divider 140.

Figure 7:
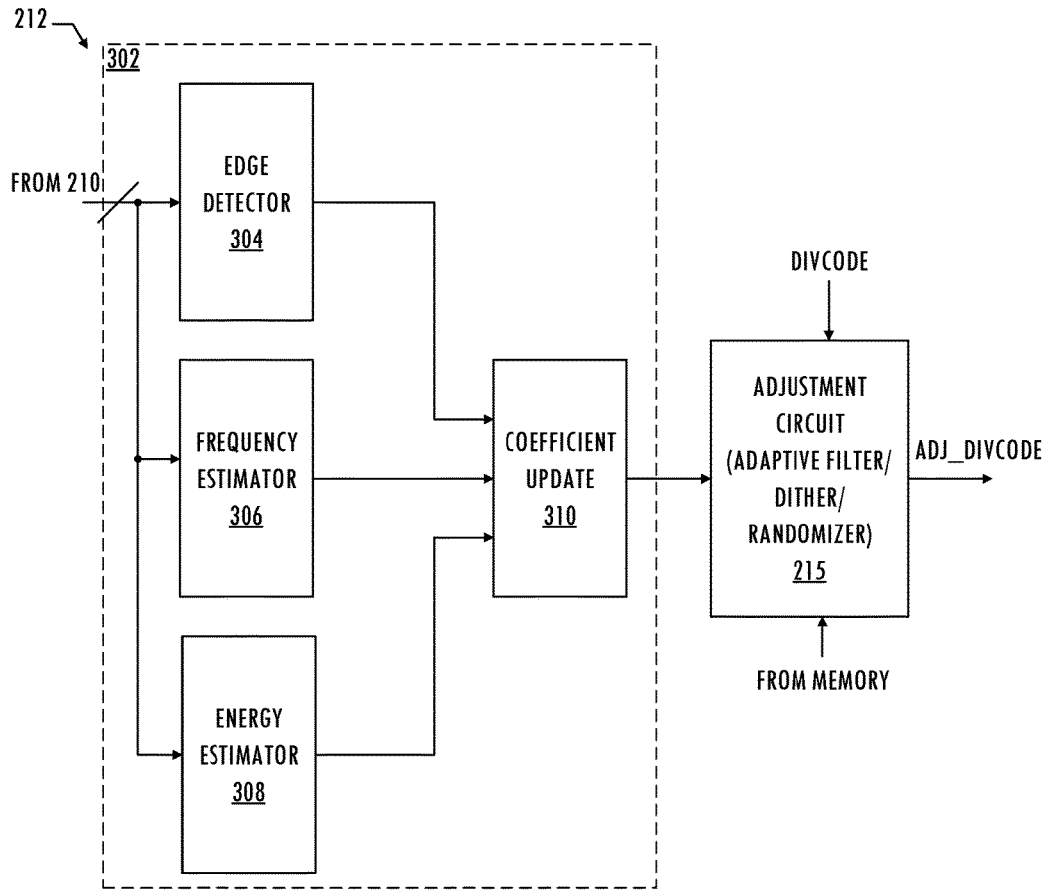
FIG. 7 illustrates a functional block diagram of an adaptive adjustment circuit consistent with at least one embodiment of the invention.

Referring to FIG. 7, in at least one embodiment of adaptive adjustment circuit 212, adjustment circuit 215 receives default values (e.g., default filter coefficients or other parameters) from memory. Coefficient handler 302 includes one or more signal processing circuits that adaptively updates those filter coefficients from default values. For example, coefficient handler 302 includes edge detector 304, frequency estimator 306, and energy estimator 308. Edge detector 304 uses digital time information received from measurement circuit 210 to generate a time average of a pulse width of output clock signal CLKOUT. If a difference between the time average of the pulse width of output clock signal CLKOUT and a target pulse width corresponding to the divide ratio is less than zero or other threshold level, then coefficient handler 302 does not update the parameters being used by adjustment circuit 215. If a difference between the time average of the pulse width of output clock signal CLKOUT and a target pulse width corresponding to the divide ratio is greater than zero or other threshold level, then coefficient handler 302 updates the parameters being used by adjustment circuit 215.

Frequency estimator 306 determines an average frequency estimate of the output clock signal based on digital time information received from measurement circuit 210. If a difference between the average frequency estimate of output clock signal CLKOUT and a target frequency corresponding to the divide ratio is less than zero or other threshold level, then coefficient handler 302 does not update the parameters being used by adjustment circuit 215. If a difference between the average frequency estimate of output clock signal CLKOUT and the target frequency corresponding to the divide ratio is greater than zero or other threshold level, then coefficient handler 302 updates the parameters being used by adjustment circuit 215.

Energy estimator 308 estimates an average energy level of output clock signal CLKOUT in a target frequency band. Energy estimator 308 compares the energy level estimate to a threshold energy level. If a difference between the energy level estimate of output clock signal CLKOUT and a threshold energy level corresponding to the divide ratio is less than zero or other threshold level, then coefficient handler 302 does not update the parameters being used by adjustment circuit 215. If the energy level estimate of the output clock signal and a threshold energy level corresponding to the divide ratio is less than zero or other threshold level, then coefficient handler 302 updates the parameters being used by adjustment circuit 215. In at least one embodiment, energy estimator 308 is configured to compare energy estimates for multiple frequency bands within a target frequency band. If one or more of those frequency bands have energy estimates that are substantially greater than other energy estimates of other frequency bands within the target frequency band, energy estimator 308 determines that a spurious tone is present in those one or more frequency bands. Frequency information corresponding to the one or more frequency bands is provided to coefficient update circuit 310, which uses that information to generate filter taps for at least one finite impulse response (FIR) filter or at least one infinite impulse response (IIR) filter included in adjustment circuit 215. The FIR filter or IIR filter attenuates or notches out the one or more spurious tones (e.g., coefficient update circuit 310 includes at least one band-stop filter or notch filter) or pushes the spurious tones into a frequency band outside a target frequency band. An exemplary IIR notch filter has a transfer function:

$$H(z) = \frac{1 + \beta a_i z^{-1} \mp \beta^2 a_y z^{-2}}{1 + \alpha a_i z^{-1} \mp \alpha^2 a_y z^{-2}},$$

and coefficient update circuit 310 uses a recursive maximum likelihood estimation technique to determine updates for the filter coefficients. Adaptive tunable filters having other transfer functions may be used (e.g., variations of least mean squares (LMS) techniques for approximating coefficients). In at least one embodiment, coefficient handler 302 adjusts filter coefficients for a filter in adjustment circuit 215 based on a difference between the time average and a second time average corresponding to the fractional divide ratio. A first difference provides slewing information that indicates a fast rate of change and is used to select coefficients when the coefficients matrix includes multiple solutions. Other embodiments of adjustment circuit 215 use multiple filters and coefficient update circuit 310 uses multiple corresponding adaptive learning circuits.

Figure 8:
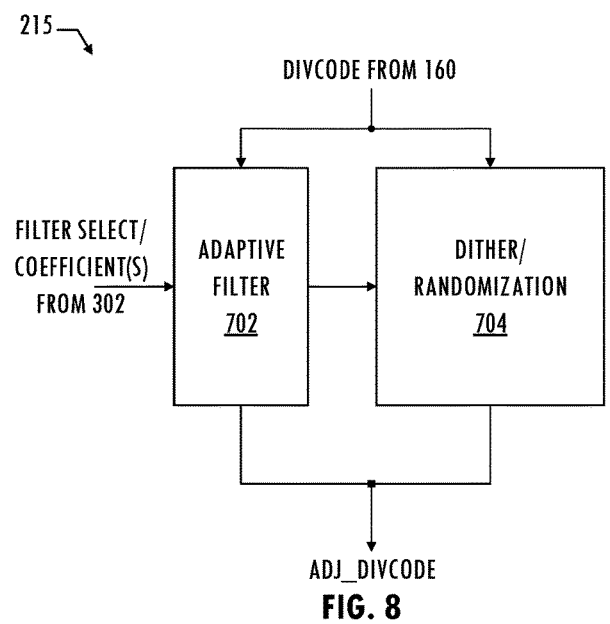
FIG. 8 illustrates a functional block diagram of an adjustment circuit consistent with at least one embodiment of the invention.

Referring to FIGS. 7 and 8, in an embodiment of adaptive adjustment circuit 212, adjustment circuit 215 includes adaptive filter 702, which includes one or more filters described above, and dither/randomization circuit 704. Dither/randomization circuit 704 is selectively enabled by coefficient handler 302 based on the outputs of edge detector 304, frequency estimator 306, or energy estimator 308, and a determination that randomization of the quantization error in control signal DIVCODE would improve the output clock signal (e.g., if the quantization error is correlated to the output clock signal). For example, the determination may include detection of repetitive patterns that cause the sigma-delta modulator to concentrate energy that cause spurious signals and/or detection of the level of the spurious signals, which is related to the order and implementation of the sigma-delta modulator and linearity of analog circuits. In at least one embodiment dither/randomization circuit 704 combines a dither signal with control signal DIVCODE (e.g., using a digital exclusive-OR operation) to generate adjusted control signal ADJ_DIVCODE. The dither signal is a pseudorandom binary sequence (PRBS) that is generated using an on-chip pseudorandom number generator (e.g., a series of registers corresponding to a polynomial function), although other suitable techniques for generating random or pseudorandom signals may be used. In at least one embodiment, adjustment circuit 212 enables adaptive filter 702 or dither/randomization 704. However, in other embodiments, adjustment circuit 215 implements both adaptive filter 702 and dither/randomization 704 and applies the dither signal to the output of adaptive filter 702 to generate adjusted control signal ADJ_DIVCODE.

Figure 9:
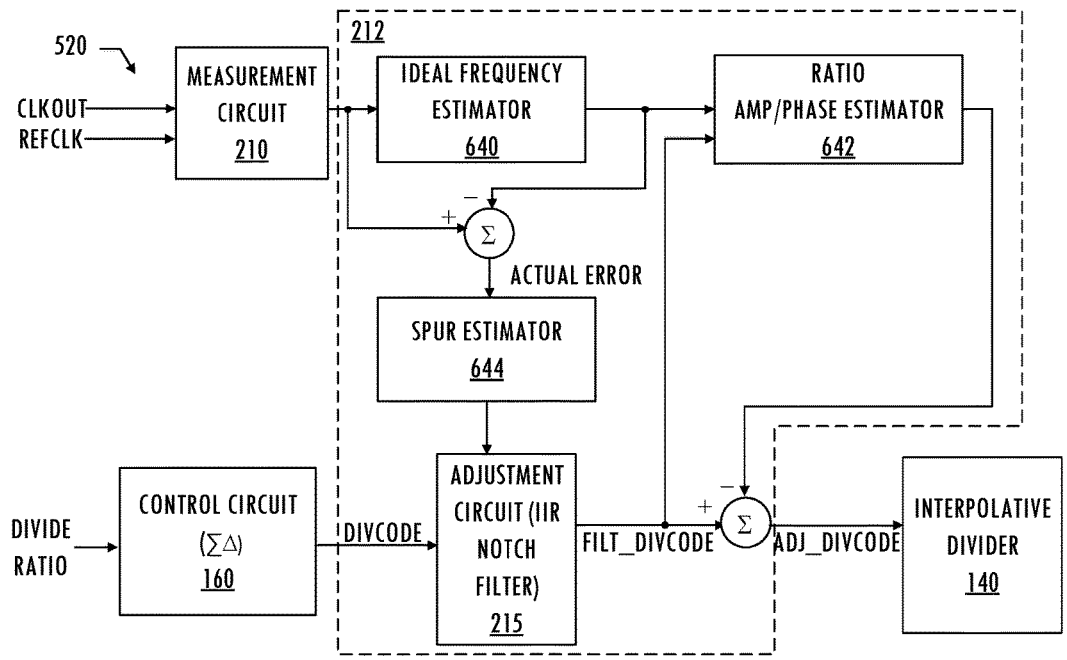
FIG. 9 illustrates a functional block diagram of an adaptive interpolative divider including a notch filter consistent with at least one embodiment of the invention.

Referring to FIG. 9, in at least one embodiment of adaptive interpolative divider and control 520, adaptive adjustment circuit 212 includes ideal frequency estimator 640, which is a low pass filter of the output of measurement circuit 210 that outputs an estimate of the ideal edge position of output clock signal CLKOUT. The difference between the output of measurement circuit 210 and the estimate of the ideal edge position is an actual error signal. Spur estimator 644 uses the actual error signal to estimate a frequency of a spurious tone based on the energy in each frequency bin of a predetermined frequency band, similar to the output of a fast-Fourier transform. Spur estimator 644 provides to adjustment circuit 215, a programmable number of frequencies corresponding to highest energy spurious tones based on energy levels in each frequency bin. Spur estimator 644 uses a recursive maximum likelihood algorithm to reduce error and the amount of computations. Amplitude/phase ratio estimator 642 determines a ratio of divergence based on the output of adjustment circuit 215 and an output of ideal frequency estimator 640 and provides a compensation signal based on the ratio of divergence. Adaptive adjustment circuit 212 provides a combination of that compensation signal and filtered control signal FILT_DIVCODE to interpolative divider 140.

Figure 10:
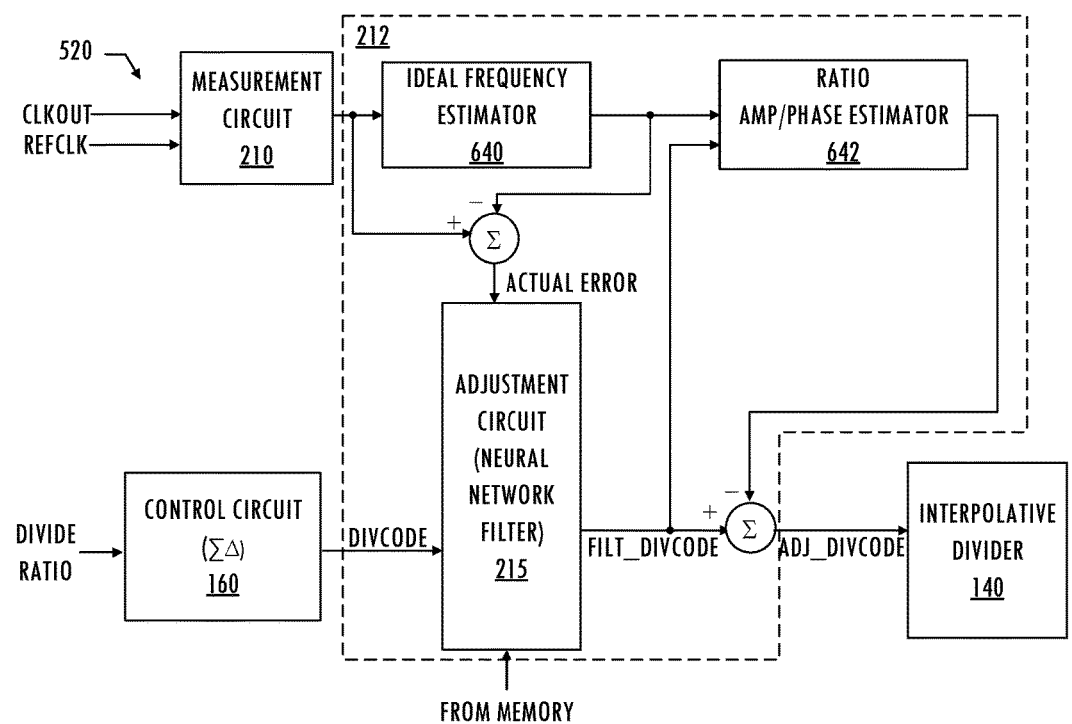
FIG. 10 illustrates a functional block diagram of an adaptive interpolative divider including a neural network filter consistent with at least one embodiment of the invention.
Figure 11:
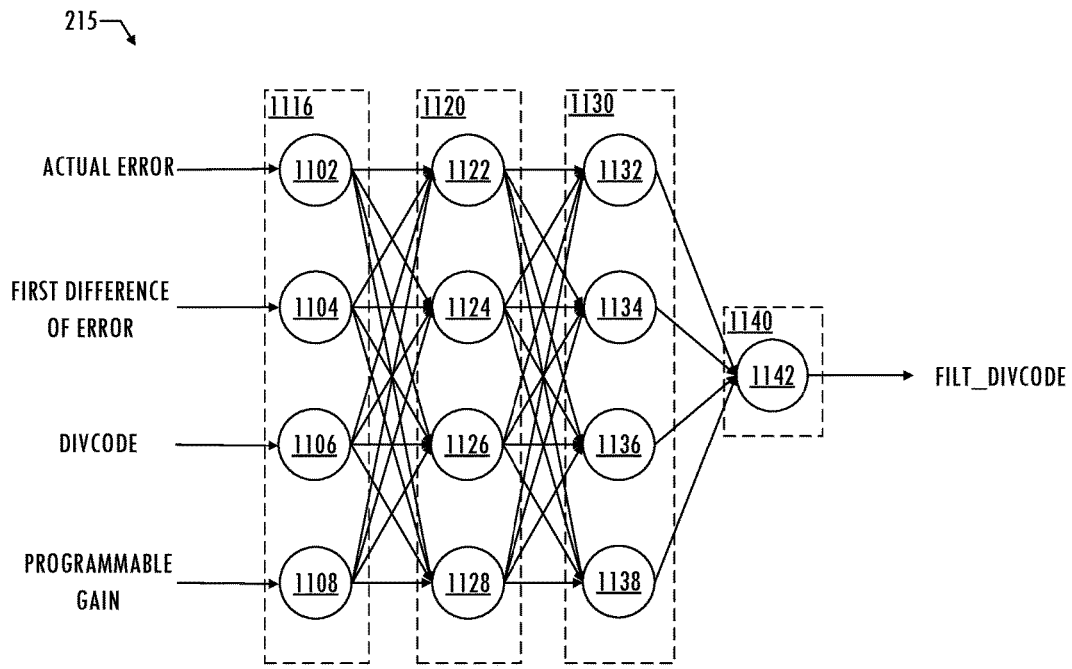
FIG. 11 illustrates a functional block diagram of an adjustment circuit including a neural network filter consistent with at least one embodiment of the invention.

FIGS. 10 and 11 illustrate embodiments of adaptive adjustment circuit 212 that excludes spur estimator 644 and includes a neural network filter implementation of adjustment circuit 215 instead of a notch filter. Input signals to the neural network filter include different components: actual error, first difference of error, control signal DIVCODE, and programmable gain. The programmable gain of the neural network filter is reduced according to the learning phase or error. The neural network filter target is a minimum of the actual error signal. In at least one embodiment, adjustment circuit 215 includes a four input, three-layer neural network filter. The neural network filter includes input layer 1116 (nodes 1102, 1104, 1106, and 1108), hidden layer 1120 (nodes 1122, 1124, 1126, and 1128), hidden layer 1130 (nodes 1132, 1134, 1136, and 1138), and output layer 1140 (node 1142). Each node has an adaptive input weight and an adaptive output weight that are used to create a weighted vector that is provided to a next node. Each node filters the corresponding inputs and provides the outputs to a node of a next layer (e.g., one or more hidden layers) until an output layer generates the output. Each node is connected to each node of the next layer and is represented by a coefficient in a matrix. Initially, neural network filter learns slowly and later learns more quickly to generate filtered control signal FILT_DIVCODE. During a learning interval, adaptive weights in each node are periodically adjusted to improve outputs for a test inputs. When an observed output causes an error to increase, a different node is changed, and adjustments continue until error improvements are no longer obtained (e.g., a minimum error is achieved)

Figure 12:
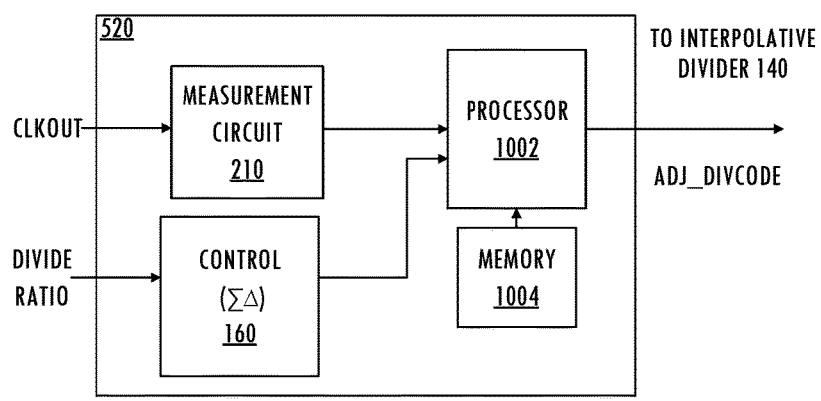
FIG. 12 illustrates a functional block diagram of an embodiment of an adaptive interpolative divider including an instruction processor consistent with at least one embodiment of the invention.
Figure 13:
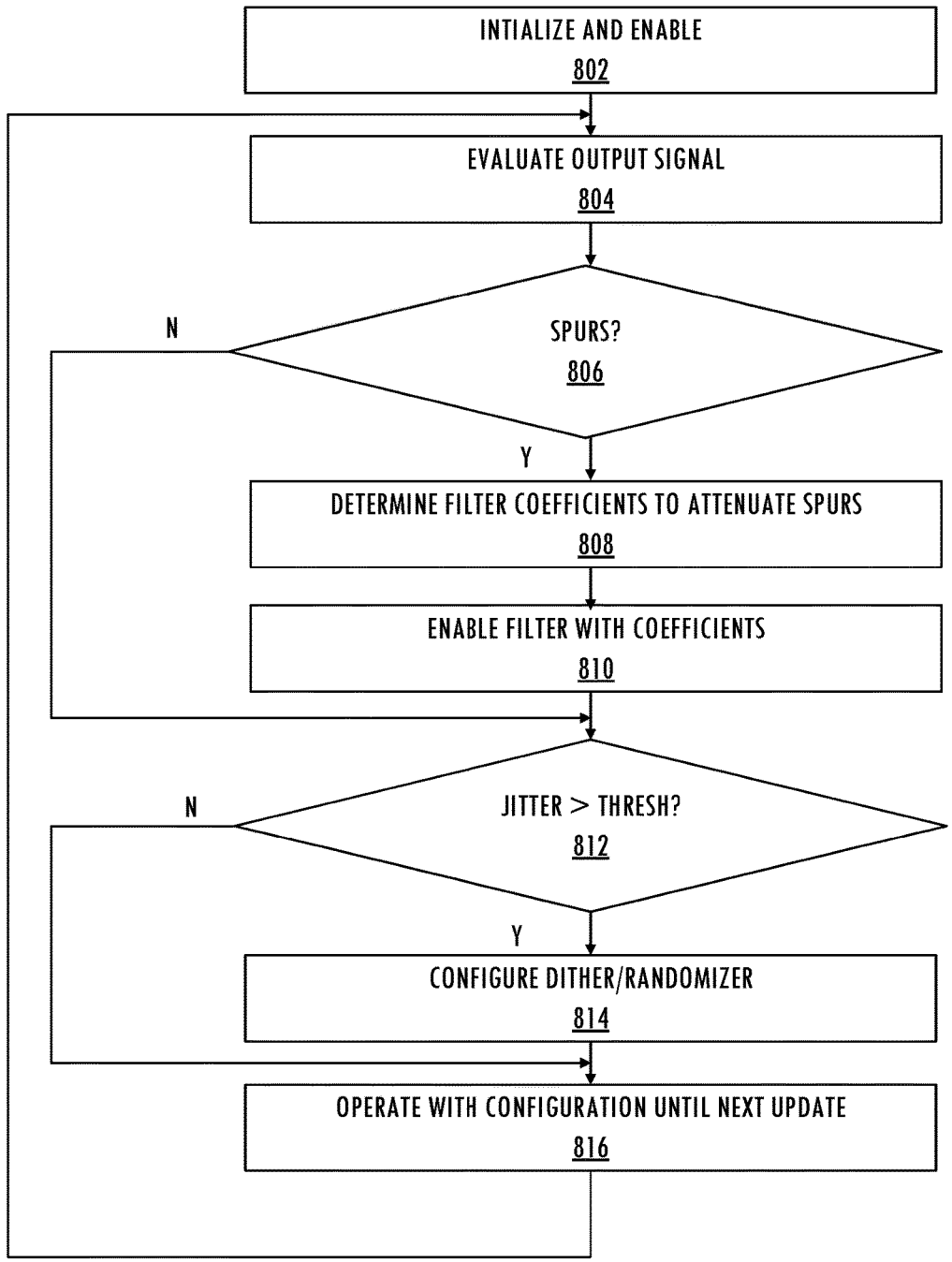
FIG. 13 illustrates information and control flows for an adaptive interpolative divider consistent with at least one embodiment of the invention.
Figure 14:
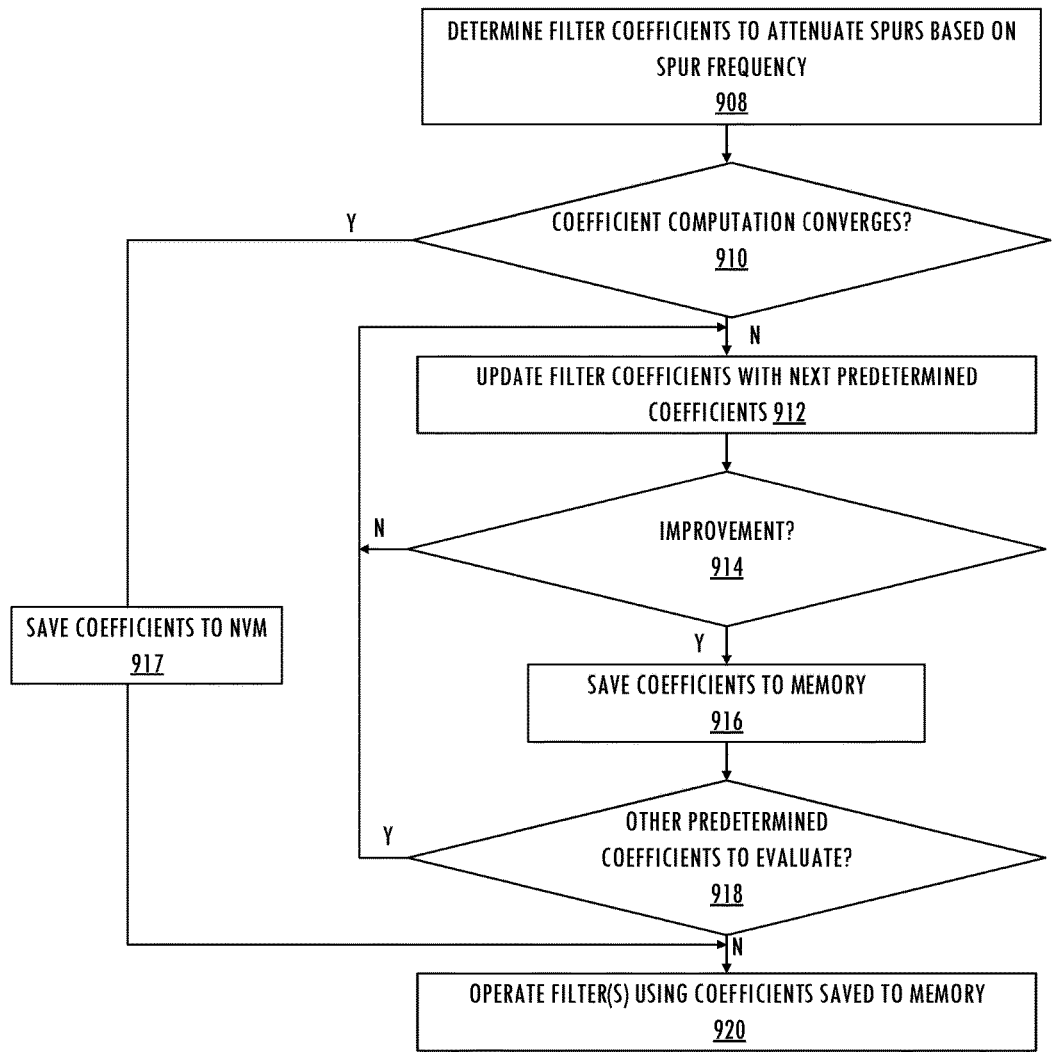
FIG. 14 illustrates information and control flows for an adaptive interpolative divider consistent with at least one embodiment of the invention.

Referring to FIGS. 5-12, one or more of structures included in adaptive adjustment circuit 212, as described herein, may be implemented using software (which includes firmware) executing on a processor or by a combination of software and hardware. Software, as described herein, may be encoded in at least one tangible (i.e., non-transitory) computer-readable medium. As referred to herein, a tangible computer-readable medium includes at least a disk, tape, or other magnetic, optical, or electronic storage medium (e.g., random access memory, read-only-memory). For example, FIG. 12 illustrates adaptive interpolative divider and control 520 that includes processor 1002, which may be a digital signal processor or other processing circuit that implements complex data processing, e.g., filter training, filtering, and modulation, by executing instructions fetched from memory 1004. Measurement circuit 210 provides digital data to processor 1002.

Referring to FIGS. 5-8 and 13, exemplary operation of adaptive adjustment circuit 212, coefficient handler 302 includes initialization of adjustment circuit 215 to a default configuration (802). An exemplary default configuration disables any dither/randomization included in adjustment circuit 215 and configures any filters in adjustment circuit 215 with all-pass coefficients or predetermined bandpass coefficients for a frequency band of interest. Any storage elements being used to track historical values of the output clock signal or historical values of filter coefficients are cleared or set to predetermined initial values. Adaptive adjustment circuit 212 then enables measurement circuit 210 for evaluation of the output clock signal and update adjustment circuit 215 (804). If coefficient handler 302 does not detect spurs in the output clock signal CLKOUT (806), then adaptive adjustment circuit 212 does not update the filter coefficients of any filter in adaptive adjustment circuit 212. If coefficient handler 302 detects spurs (806), then coefficient handler 302 determines filter coefficients that will attenuate those spurs (808) and updates a corresponding filter in adjustment circuit 212 to enable operation of the corresponding filter with the updated coefficients (810). If coefficient handler 302 detects jitter in the output clock signal that exceeds a predetermined threshold value (812), then coefficient handler 302 enables dither/randomization (814) and disables it otherwise. Adjustment circuit 215 operates with a configuration until a next update, which may occur periodically, or based on a reset or other control flow change (816). Thus, adaptive adjustment circuit 212 operates in a continuous feedback loop. In some embodiments, adaptive adjustment circuit 212 ceases updating stored parameters in response to detecting a target (e.g., optimal) operating point. An exemplary optimal operating point is detected by the error falling below a threshold or the error being relatively constant over one or more learning intervals. The optimal operating point is reevaluated over time to determine whether a lower error operating point is achievable.

Referring to FIGS. 5-8 and 14, in at least one embodiment, coefficient handler 302 includes a state machine that computes filter coefficients to attenuate spurs based on spur frequency information detected by coefficient handler 302 (908). If the coefficient computation converges (910) then coefficient handler 302 saves those coefficients to memory (917). If the computation does not converge (910), the coefficient handler 302 updates the coefficients with a next set of predetermined coefficients stored in memory (912).

Coefficient handler 302 determines whether the current coefficients provide any improvement to output clock signal CLKOUT based on previously-stored performance metrics and on an average of the divide ratio (914). For example, although a set of coefficients result in a filter that attenuates spurious tones, if the average frequency of the output clock signal varies from the frequency corresponding to the target divide ratio, coefficient handler 302 rejects the set of coefficients for not improving performance.

If the next set of predetermined coefficients did improve performance (914), then coefficient handler 302 saves that next set of predetermined coefficients in memory as the current coefficients (916). If any additional predetermined coefficients are stored in memory (918), coefficient handler 302 evaluates the performance of output clock signal CLKOUT and updates the stored coefficients with any that improve performance of output clock signal CLKOUT (912, 914, 916). Coefficient handler 302 provides the saved coefficients to adjustment circuit 212 for operation (920).

In at least one embodiment, coefficient handler 302 stores at least one set of coefficients to memory that improve performance. However, the number of sets of coefficients for each filter may be selectable. If the selected number is greater than one, then a state machine in coefficient handler 302 periodically updates corresponding filters in adjustment circuit 212 with a set of coefficients in sequential order.

In at least one embodiment, an integrated circuit implementing the adaptive adjustment technique stores coefficients in memory. Those stored coefficients may be extracted from the integrated circuit (e.g., by a read to memory using an integrated circuit interface) and provided to a second integrated circuit (e.g., another instantiation of the integrated circuit configured for the same application). The second integrated circuit uses those coefficients as initial coefficients and implements the adaptive adjustment technique to improve performance over time. Thus, the adaptive adjustment technique reduces the need for using an external spectrum analyzer and redesign of conventional fixed notch filtering techniques. Note that embodiments of techniques described herein are used with other techniques for addressing nonlinearity and gain calibration of interpolative divider analog circuits.

Thus, embodiments of a clock synthesizer and interpolative divider adaptive adjustment techniques that reduce or eliminate spurs associated with phase interpolator have been described. Unlike conventional systems, if the target frequency changes, the adaptive adjustment technique dynamically updates the adjustment circuit. Note that the adaptive adjustment techniques described above not only correct for nonidealities in the output frequency divider but also for nonidealities in the signal input to the output frequency divider. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. An apparatus comprising:
   a frequency divider configured to generate an output clock signal based on an input clock signal and an adjusted frequency divider control signal, the output clock signal being a frequency-divided version of the input clock signal;
   a measurement circuit configured to provide digital time information corresponding to an edge of the output clock signal; and
   an adaptive adjustment circuit configured to generate the adjusted frequency divider control signal based on a frequency divider control signal and the digital time information, the frequency divider control signal approximating a fractional divide ratio,
   wherein the adaptive adjustment circuit comprises:
      an adaptive filter configured to generate the adjusted frequency divider control signal using filter coefficients; and
      a coefficient handler configured to update the filter coefficients based on the digital time information and a target frequency band.

2. The apparatus, as recited in claim 1, wherein the measurement circuit is a time-to-digital converter configured to provide as the digital time information a digital time code corresponding to a delay between the edge of the output clock signal with respect to a corresponding edge of a reference signal.

3. The apparatus, as recited in claim 1, wherein the coefficient handler comprises:
   an edge estimator configured to generate a time average of a pulse width of the output clock signal based on the digital time information, and
   wherein the coefficient handler is configured to adjust the filter coefficients based on a difference between the time average and a second time average corresponding to the fractional divide ratio.

4. The apparatus, as recited in claim 1, wherein the coefficient handler comprises:
   a frequency estimator configured to estimate an average frequency estimate of the output clock signal based on the digital time information, and
   wherein the coefficient handler is configured to adjust the filter coefficients based on the average frequency estimate and a target frequency corresponding to the fractional divide ratio.

5. The apparatus, as recited in claim 1, wherein the coefficient handler comprises:
   an energy estimator configured to estimate an energy level of the output clock signal in the target frequency band, the coefficient handler being configured to identify a spurious tone in the output clock signal based on the energy level,
   wherein the coefficient handler is configured to adjust the filter coefficients based on identification of the spurious tone.

6. The apparatus, as recited in claim 1, wherein the adaptive adjustment circuit comprises:
a band-stop filter configured to generate the adjusted frequency divider control signal based on the frequency divider control signal and the filter coefficients,
wherein the coefficient handler comprises:
a filter tap selector configured to provide filter coefficients to the band-stop filter, the filter coefficients determined based on a frequency of a spurious tone detected in the target frequency band.

7. The apparatus, as recited in claim 1, wherein the adaptive adjustment circuit comprises:
a band-stop filter configured to generate the adjusted frequency divider control signal based on the frequency divider control signal and the filter coefficients, and
wherein the coefficient handler comprises a state machine configured to sequentially select filter coefficients from a plurality of predetermined filter coefficients and to determine whether selected filter coefficients improve jitter or spurious tones of the output clock signal.

8. The apparatus, as recited in claim 1, wherein the coefficient handler comprises:
a storage element; and
a state machine configured to implement a non-empirical sequence of coefficient updates, store associated measurements in the storage element, and to select the filter coefficients from a corresponding set of coefficients based on associated measurements in the storage element.

9. An apparatus comprising:
a frequency divider configured to generate an output clock signal based on an input clock signal and an adjusted frequency divider control signal, the output clock signal being a frequency-divided version of the input clock signal;
a measurement circuit configured to provide digital time information corresponding to an edge of the output clock signal; and
an adaptive adjustment circuit configured to generate the adjusted frequency divider control signal based on a frequency divider control signal and the digital time information, the frequency divider control signal approximating a fractional divide ratio, wherein the adaptive adjustment circuit comprises:
a randomizer configured to generate the adjusted frequency divider control signal using randomizer coefficients; and
a coefficient handler configured to update the randomizer coefficients based on the digital time information.

10. A method for reducing spurs in a clock signal comprising:
generating a frequency divider control signal comprising a sequence of integer divide values approximating a fractional divide ratio;
generating an output clock signal based on an input clock signal and an adjusted frequency divider control signal, the output clock signal being a frequency-divided version of the input clock signal;
providing digital time information based on the output clock signal; and
generating the adjusted frequency divider control signal based on the frequency divider control signal and the digital time information, wherein generating the adjusted frequency divider control signal comprises:
filtering the frequency divider control signal using filter coefficients; and
updating the filter coefficients based on the digital time information and a target frequency band.

11. The method, as recited in claim 10, wherein providing digital time information comprises:
generating a digital code corresponding to a delay between an edge of the output clock signal with respect to a corresponding edge of a reference signal.

12. The method, as recited in claim 10, wherein updating the filter coefficients comprises:
generating a time average of a pulse width of the output clock signal based on the digital time information; and
adjusting the filter coefficients based on a difference between the time average and a second time average corresponding to the fractional divide ratio.

13. The method, as recited in claim 10, wherein updating the filter coefficients comprises:
estimating an average frequency estimate of the output clock signal based on the digital time information, and
adjusting the filter coefficients based on the average frequency estimate and a target frequency corresponding to the fractional divide ratio.

14. The method, as recited in claim 10, wherein updating the filter coefficients comprises:
estimating an energy level of the output clock signal in the target frequency band; and
adjusting the filter coefficients based on the energy level and a threshold energy level.

15. The method, as recited in claim 10, wherein generating the adjusted frequency divider control signal comprises:
applying a dither to the frequency divider control signal.

16. The method, as recited in claim 10, further comprising:
extracting the filter coefficients from a first integrated circuit;
providing the filter coefficients to a second integrated circuit; and
initializing a corresponding filter of the second integrated circuit with the filter coefficients.

17. The method, as recited in claim 10, wherein generating the adjusted frequency divider control signal comprises:
evaluating a performance metric for the output clock signal; and
using a default adjustment to the frequency divider control signal in response to an adjustment to the frequency divider control signal degrading the performance metric.

* * * * *